(12) United States Patent  
Lee et al.

(10) Patent No.: US 8,315,102 B2  
(45) Date of Patent: Nov. 20, 2012

(54) MULTI-BIT FLASH MEMORY DEVICES AND METHODS OF PROGRAMMING AND ERASING THE SAME

(75) Inventors: Se-Hoon Lee, Gyeonggi-do (KR); Choong-Ho Lee, Gyeonggi-do (KR); Jung-Dal Choi, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 13/289,689

(22) Filed: Nov. 4, 2011

(65) Prior Publication Data

US 2012/0051141 A1   Mar. 1, 2012

Related U.S. Application Data

(62) Division of application No. 12/471,729, filed on May 26, 2009, now Pat. No. 8,072,804.

(30) Foreign Application Priority Data

Jul. 22, 2008   (KR) .................................. 2008-71286

(51) Int. Cl.  
*G11C 11/34* (2006.01)

(52) U.S. Cl. .......... 365/185.18; 365/185.03; 365/185.33

(58) Field of Classification Search ............. 365/185.18, 365/185.03, 185.33, 148, 189.16, 185.17, 365/185.05, 185.24, 185.29, 189.04, 185.12, 365/185.28, 185.11  
See application file for complete search history.

(56) References Cited

U.S. PATENT DOCUMENTS

| | | | |
|---|---|---|---|
| 7,180,775 B2 | 2/2007 | Meir | |
| 7,518,914 B2 | 4/2009 | Han | |
| 2007/0274128 A1 | 11/2007 | Kamei | |
| 2008/0055985 A1 | 3/2008 | Kanda | |
| 2008/0074921 A1 | 3/2008 | Kinoshita | |
| 2008/0198651 A1 | 8/2008 | Kim | |
| 2009/0073771 A1 | 3/2009 | Li | |
| 2009/0290414 A1* | 11/2009 | Hosono | 365/185.03 |
| 2012/0069654 A1* | 3/2012 | Cho et al. | 365/185.03 |

FOREIGN PATENT DOCUMENTS

KR   1020040044938 A   5/2004

\* cited by examiner

*Primary Examiner* — Dang Nguyen  
(74) *Attorney, Agent, or Firm* — Myers Bigel Sibley & Sajovec, P.A.

(57) ABSTRACT

A non-volatile memory device includes an array of non-volatile memory cells configured to support single bit and multi-bit programming states. A control circuit is provided, which is configured to program a first page of non-volatile memory cells in the array as M-bit cells during a first programming operation and further configured to program the first page of non-volatile memory cells as N-bit cells during a second programming operation. The first and second programming operations are separated in time by at least one operation to erase the first page of non-volatile memory cells. M and N are unequal integers greater than zero.

6 Claims, 7 Drawing Sheets

MULTI-BIT FLASH MEMORY DEVICES AND METHODS OF PROGRAMMING AND ERASING THE SAME

REFERENCE TO PRIORITY APPLICATION

This U.S. non-provisional patent application is a divisional of U.S. patent application Ser. No. 12/471,729, filed May 26, 2009, now U.S. Pat. No. 8,072,804, and claims priority to Korean Patent Application No. 10-2008-0071286, filed Jul. 22, 2008, the entire contents of which are hereby incorporated by reference.

FIELD OF THE INVENTION

The present invention relates to semiconductor memory devices and, more particularly, to programming and erasing methods in flash memory devices.

BACKGROUND

Semiconductor memory devices are generally classified into volatile and nonvolatile types. Volatile semiconductor memory devices are operable at high rates of reading and writing, but can lose their data when there is no power supply. But, nonvolatile semiconductor memory devices are able to retain their data even without power supply. Thus, nonvolatile semiconductor devices are widely used in various applications that require data retention regardless of power supply. There are many kinds of nonvolatile semiconductor memories, e.g., mask read-only memories (MROMs), programmable ROMs (PROMs), erasable and programmable ROMs (EPROMs), electrically erasable and programmable ROMs (EEPROMs), and so forth.

Generally, it is inconvenient for users to update information from MROMs, PROMs, and EPROMs because those memories are not easily erased and written with new data. In contrast, EEPROMs are able to be electrically erased and written with data, and are increasingly used as subsidiary storage units or system programming tools that necessitate steady data updates. Moreover, flash EEPROMs can be fabricated with higher integration density than traditional EEPROMs, which make them more useful in applications for large capacity subsidiary memory units. NAND-type flash EEPROMs (hereinafter, referred to as 'NAND flash memories') can be more advantageous to integration density than other types of the flash EEPROMs (i.e., flash memories).

In flash memories, a storable (permissible or available) programmed state of a memory cell is determined by the number of bits stored in the memory cell. A memory cell storing 1-bit data (or a single data bit) is referred to as 'single-bit cell' or 'single-level cell' (SLC). A memory cell storing multi-bit data (or two or more data bits) is referred to as 'multi-bit cell', 'multi-state cell', or 'multi-level cell' (MLC). With increasing demands for high-density memory devices in recent years, many studies are proceeding about multi-level flash memories capable of storing multi-bit data per memory cell.

SUMMARY

Non-volatile memory devices according to embodiments of the present invention include an array of non-volatile memory cells configured to support single bit and multi-bit programming states. A control circuit is also provided. The control circuit may include, among other sub-circuits, a voltage generating circuit, control logic and a read/write circuit, for example. The control circuit may be configured to program a first page of non-volatile memory cells in the array as M-bit cells during a first programming operation and may be further configured to program the first page of non-volatile memory cells as N-bit cells during a second programming operation, where M and N are unequal integers greater than zero. The first and second programming operations may be separated in time by at least one operation to erase the first page of non-volatile memory cells using, for example, a block erase operation.

According to additional embodiments of the invention, the array of non-volatile memory cells may include a second page of non-volatile memory cells located immediately adjacent the first page of non-volatile memory cells. In these embodiments, the control circuit is configured to program the second page of non-volatile memory cells in the array as N-bit cells during the first programming operation and subsequently reprogram the second page of non-volatile memory cells as M-bit cells during the second programming operation.

The array of non-volatile memory cells may also include at least a first block of non-volatile memory cells therein. In these embodiments, the control circuit may be configured to program a plurality of even pages of non-volatile memory cells associated with even word lines within the first block and a plurality of odd pages of non-volatile memory cells associated with odd word lines within the first block as M-bit cells and N-bit cells, respectively, during a first block programming operation. This control circuit may also be configured to program the plurality of even pages of non-volatile memory cells and the plurality of odd pages of non-volatile memory cells as N-bit cells and M-bit cells, respectively, during a second block programming operation that is separated in time from the first block programming operation by at least one operation to erase the first block of non-volatile memory cells.

According to additional embodiments of the invention, the array of non-volatile memory cells may include a plurality of flag cells and the control circuit may be configured to program the plurality of flag cells with respective bit counts that specify whether corresponding pages of non-volatile memory cells in the array are to be treated as M-bit cells or N-bit cells during programming and reading operations. The control circuit may also include a read/write circuit therein. This read/write circuit may be electrically coupled to the array of non-volatile memory cells. The read/write circuit is configured to read bit counts from the array during the first and second programming operations. According to still further embodiments of the invention, the control circuit may be configured to adjust program verify voltages within the read/write circuit based on the values of the bit counts read from the array during the first and second programming operations. The control circuit may also be configured to program the array of non-volatile memory cells with a bit count(s) in response to a block erase operation.

According to still further embodiments of the present invention, a method of operating a flash memory device may include reading a first bit count from a block of flash memory, in response to a first command to program a first page of memory cells in the block of flash memory. This reading step may be followed by programming the first page of memory cells with a first page of data using the first bit count to specify a first number of bits of data to be stored in the first page of memory cells. This programming of the first page of memory cells is followed by erasing the first page of memory cells and then programming the block of flash memory with a second bit count that specifies a second number of bits of data to be stored in the first page of memory cells. The first bit count and the second bit count may be unequal. For example, the first bit count may be a single-bit digital value (e.g., 0 or 1), which specifies whether the non-volatile memory cells are single level cells (SLCs) that store a single bit of data or multi-level cells (MLCs) cells that store two or more bits of data. This second bit count may also be read from the block of flash memory, in response to a second command to program the first page of memory cells. Thereafter, the first page of memory cells may be programmed with a second page of data using the second bit count to specify the second number of bits of data to be stored in the first page of memory cells.

According to further embodiments of the invention, a method of operating a flash memory device includes reading a first bit count stored in the flash memory device, and programming a page of non-volatile memory cells in the flash memory device using the first bit count to specify a first number of bits of data to be stored in each of a plurality of non-volatile memory cells within the page. This method may also include erasing the page of non-volatile memory cells. A second bit count, which is stored in the flash memory device, may then be read. This second bit count may have a value greater than or less than the first bit count. The page of non-volatile memory cells is then programmed using the second bit count to specify a second number of bits of data to be stored in each of the plurality of non-volatile memory cells within the page.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Preferred embodiments of the present invention will be described below, exemplarily involving a flash memory device in depicting and illustrating structural and operational features according to the present invention.

In this description, circuit or functional organizations of the flash memory by the present invention, or programming and erasing operations thereby, are simply exemplified as practical features. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A new flash memory device proposed by the present invention is structured in a form that is variable with the number of bits stored in each cell in the unit of word line. The number of bits allocated to each word line can be modified differently, without fixed to a specific value, every erasing operation. Information about the number of bits allocated to each word line is reserved and managed in the unit of block (or in the unit of at least one or more word lines), not stored respective to all of word lines. Hereinafter will be described about the details of the flash memory device in conjunction with the accompanying drawings.

Figure 1:
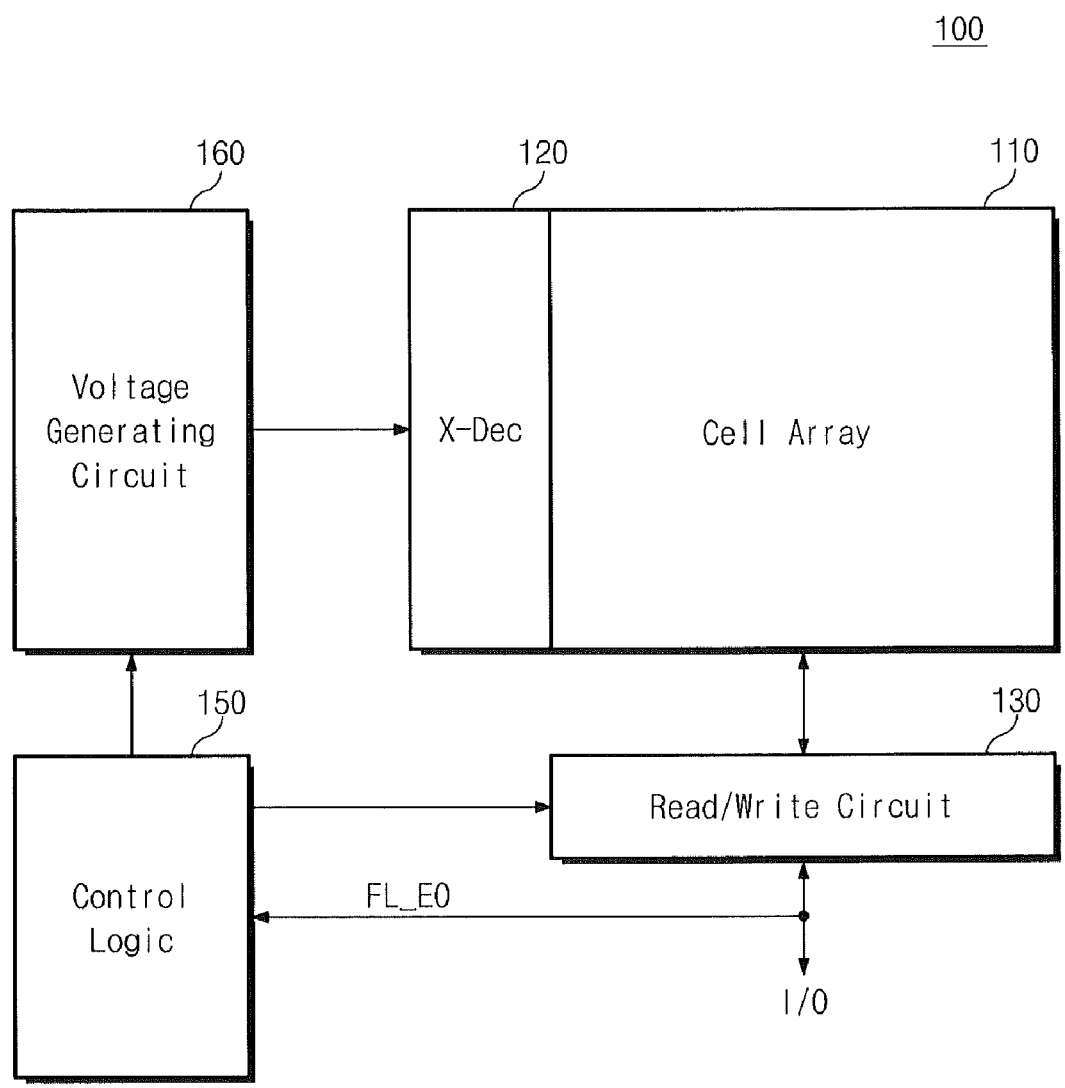
FIG. 1 is a block diagram of a flash memory device according to an embodiment of the present invention.

FIG. 1 is a block diagram of a flash memory device according to the present invention. Referring to FIG. 1, the flash memory device 100 of the present invention is comprised of a memory cell array 110, a decoding circuit (X-Dec) 120, a reading/writing circuit 130, a control logic circuit 150, and a voltage generating circuit 160. The read/write circuit 130, control logic 150 and voltage generating circuit 160 may be components of a control circuit that is configured to perform the operations described herein. The memory cell array 110 is formed by including pluralities of memory cells arranged in pluralities of rows (or word lines) and columns (or bit lines). The memory cell array 110 can be sectored into a main field for storing normal data, and a spare field for storing accessory information relevant to the main field and normal data (e.g., flag information, error correction code, device code, maker code, page information, etc.). In a NAND flash memory, programming and reading operations are conducted in the unit of page while an erasing operation to programmed data is conducted in the unit of block that is composed of multiple pages. Information involved in the programming or erasing operation to each page can be stored in an allocated memory cell of the spare field (or a partial area of the main field). The main and spare fields may be settled in various patterns on the memory cell array 110, without a specific form of disposition. In addition, the numbers of bits stored each in the memory cells of the main and spare fields can be designed in variety. For instance, each memory cell of the main and spare fields may be designed to store M or N-bit data (M and N are a positive integer, but M≠N).

As will be detailed hereinafter, the number of bits stored in each memory cell of the flash memory device 110 by the present invention can be set and modified in the unit of word line. According as that, by adjusting the number of bits storable in a memory cell allocated to an adjacent word line, it is able to lessen an effect of capacitive couplings caused from memory cells the adjacent word line. The capacitive coupling effect from memory cells of an adjacent word line will be detailed later with reference to FIG. 6. Meanwhile, the number of bits storable in a memory cell (hereinafter referred to as 'bit count per cell'), which is set in the unit of word line, can be changed to another value after an erasing operation to the corresponding memory cell, not being steadily fixed to a specific one. According to such a modification of bit count per cell, it is able to prevent stress from concentrating on a specific word line. This transaction is reflected on a wear leveling process, extending a lifetime of the flash memory device 100 more effectively.

Resultant patterns of bit count allocations respective to word lines may be arranged along the word lines in regularity. Therefore, according to the present invention, it stores and manages flag information FL_EO (hereinafter referred to as 'bit count information') about the bit count per cell by allocating at least a flag cell every block, not storing all bit counts per word line. For example, even if there is assigned a plurality of the bit count information FL_EO that correspond to plural word lines in a block, the present invention is configured to store and manage one of the bit count information FL_EO for one block, not storing all of the plurality of the bit count information FL_EO. In this case, the regularity of the plural bit count information FL_EO along the word line must be learned by the control logic circuit 150 or an external system (e.g., controller or host). The flag cell for storing the bit count information FL_EO can be prepared by means of a memory cell belong to the spare or main field.

The voltage generating circuit 160 operates to generate word line voltages (e.g., program voltage Vpgm, read voltage Vread, pass voltage Vpass) to be applied each to word lines, and voltage to be supplied to a bulk (e.g., well region) where memory cells are formed. Voltage generation by the voltage generating circuit 160 is carried out by the control logic circuit 150. The decoding circuit 120 selects one of memory blocks (or sectors) from the memory cell array 110 in response to control by the control logic circuit 150, and designates one of word lines from the selected memory block. The decoding circuit 120 provides the selected and unselected word lines with the word line voltage supplied from the voltage generating circuit 160 in response to control by the control logic circuit 150.

The control logic circuit 150 functions to control general procedures for the programming, erasing, and reading operations. Data to be programmed (hereinafter referred to as 'program data') is loaded into the writing/reading circuit 130 through a buffer (not shown) under control by the control logic circuit 150.

The writing/reading circuit 130 is controlled by the control logic circuit 150, functioning as a sense amplifier or writing driver in accordance with an operation mode. For instance, in a verify/normal reading operation mode, the writing/reading circuit 130 acts as a sense amplifier for reading data from the memory cell array 110. During the normal reading operation, data read by the writing/reading circuit 130 is output to an external system (e.g., controller or host) by way of a buffer. During the verify-reading operation, data read by the writing/reading circuit 130 is provided to a pass/fail verifying circuit (not shown), not outputting to the external.

The reading operation with the writing/reading circuit 130 can be applied even to the spare field as well as the main field. The writing/reading circuit 130 is also able to conduct an operation for sensing accessory information such as the bit count information FL_EO, normal data as well. Flag cells storing the bit count information FL_EO may be partly assigned to the main or spare field of the memory cell array 110.

During the programming operation, the writing/reading circuit 130 operates as a writing driver for activating bit lines in accordance with data to be stored (i.e., program data) into the memory cell array 110. The writing/reading circuit 130 receives program data, i.e., data to be stored into the memory cell array 110, from a buffer and drives bit lines in correspondence with the received data. For this function, the writing/reading circuit 130 may be configured by including pluralities of page buffers (not shown) that correspond each to columns (or bit lines) or column pairs (or bit line pairs). The programming and reading operations by the writing/reading circuit 130 are carried out independently to each bit (e.g., LSB or a higher bit of LSB) allocated to each memory cell in response to control of the control logic circuit 150. The programming operation by the writing/reading circuit 130 is applied even to the spare field as well as the main field. The writing/reading circuit 130 is also able to conduct an operation for programming accessory information such as the bit count information FL_EO, normal data as well. The bit count information FL_EO can be stored in the unit of one or more word lines, or in the unit of one block. Flag cells storing the bit count information FL_EO may be partly assigned to the main or spare field of the memory cell array 110.

As follows act the writing/reading circuit 130 and the control logic circuit 150 relevant to the bit count information FL_EO in the programming and erasing operation modes During the programming operation, the writing/reading circuit 130 reads the bit count information FL_EO allocated to selected memory cells, responding to control by the control logic circuit 150. The bit count information FL_EO read from the memory cell array 110 is provided to the control logic circuit 150. The control logic circuit 150 functions to control the number of times for applying the program voltages Vpgm used in programming loops, voltage levels, durations of applying voltages, and so forth with reference to the program-prosecution states of pages and the bit count information FL_EO provided from the writing/reading circuit 130. For instance, by controlling the decoding circuit 120, the voltage generation circuit 160, and the writing/reading circuit 130, the control logic circuit 150 enables the program voltage Vpgm, the pass voltage Vpass, and 0V to be applied to a selected word line, unselected word lines, a bulk of the memory cells, respectively, during a programming period. The program voltage Vpgm can be generated in an incremental step-pulse programming (ISPP) mode. In the ISPP mode, a level of the program voltage Vpgm is stepping up by an increment $\Delta V$ every repetition of programming loop. The voltages Vpgm and Vpass applied to word lines during a programming period and the voltage increment $\Delta V$ of the program voltage Vpgm are variable in accordance with the bit account information FL_EO provided from the writing/reading circuit 130.

The bit count information FL_EO read by the writing/reading circuit 130 may be utilized in determining levels of the read voltages for the normal and verify-reading operations, as well as in controlling the programming operation. The programming through reading operations conducted by the present invention may be modified or transformed into various modes under control of the control logic circuit 150 or an external system (e.g., controller).

During the erasing operation, the writing/reading circuit 130 reads the bit count information FL_EO, which is allocated to a memory block to be erased, in response to control of the control logic circuit 150. The bit count information FL_EO read therefrom is backed up into a data storage space (e.g., internal register or external controller), but the memory block to be erased, in response to control by the control logic circuit 150. After erasing a selected memory block, the backed-up bit count information FL_EO is updated to be a new value by the control logic circuit 150. The updated bit count information FL_EO is recorded into a flag cell corresponding thereto by way of the writing/reading circuit 130. Such an erasing operation according to the present invention may be modified or transformed in various patterns by control of the control logic circuit 150 or an external system (e.g., controller).

FIGS. 2 through 6 are diagrams illustrating structural configurations of the memory cell array 110 shown in FIG. 1. FIGS. 2 through 6 exemplarily show allocation patterns of the bit count information FL_EO in accordance with the present invention. Additionally, the configurations of the memory cell array 110 illustrated in FIGS. 2 through 6 are applicable to memory cells belonging even to the spare field, the main field as well.

Figure 2:
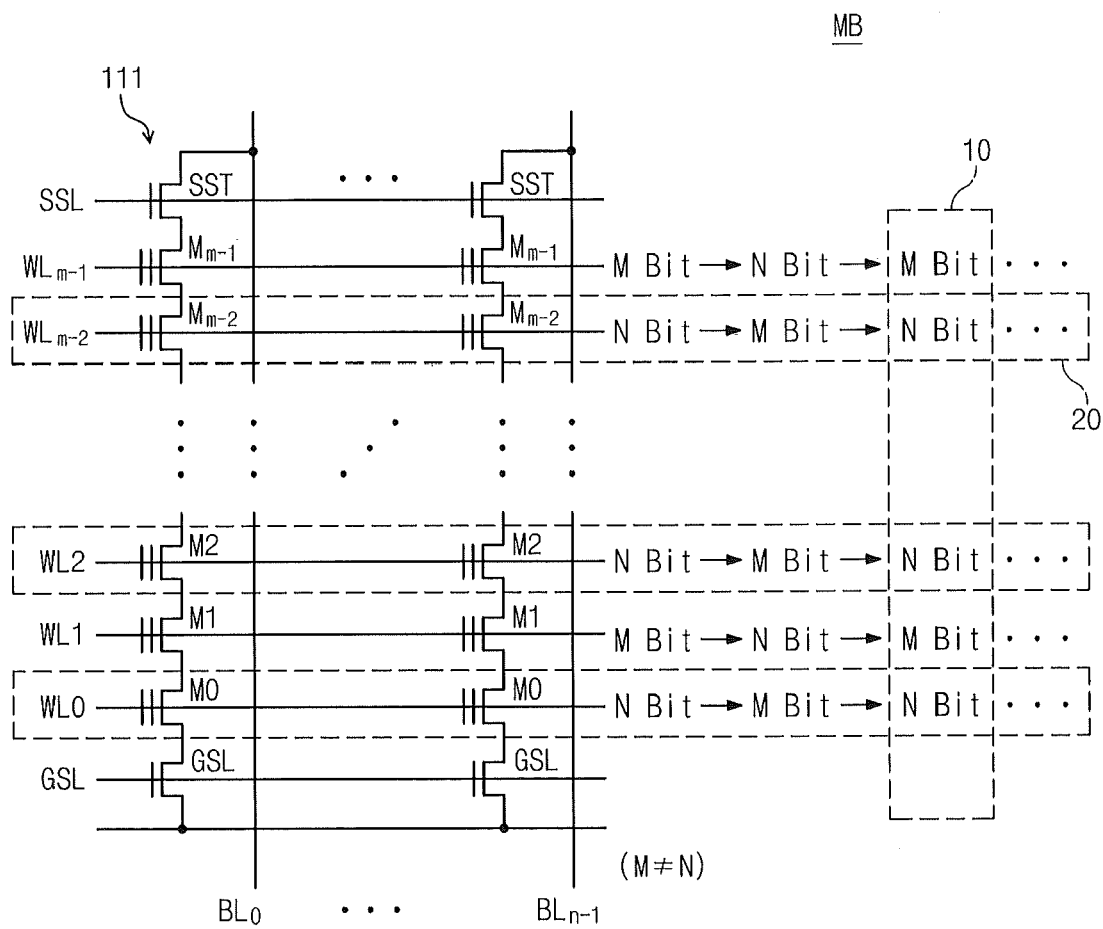
FIGS. 2 through 6 are diagrams illustrating structural configurations of the cell array shown in FIG. 1.

Referring to FIG. 2, the plural memory cells of the memory cell array 110 may form pluralities of memory blocks MBs. A single memory block MB includes pluralities of strings arranged respective to pluralities of columns or bit lines BL0~BLn-1.

Each string 111 is formed of a string selection transistor SST, pluralities of memory cells M0~Mm-1, and a ground selection transistor GST. In the string 111, a drain of the string selection transistor SST is connected to a bit line corresponding thereto and a source of the ground selection transistor GST is connected to a common source line CSL. Between a source of the string selection transistor SST and a drain of the ground selection transistor GST are serially connected the plural memory cells M0~Mm-1. Control gates of memory cells arranged on the same row are commonly connected to word lines WL0~WLm-1 corresponding thereto. The string selection transistor GST is controlled by a voltage applied thereto through a string selection line SSL and the ground selection transistor GST is controlled by a voltage applied thereto through a ground selection line GSL. And the memory cells M0~Mm-1 are controlled by voltages applied thereto through their corresponding word lines WL0~WLm-1. The memory cells M0~Mm-1 coupled each to the word lines WL0~WLm-1 store data in a quantity of one or plural pages. The memory cells M0~Mm-1 may be the same in physical structure, but different from each other in bit count. For instance, it is definable for the memory cells M0~Mm-1 to store data with bit counts different from each other every one or more word lines at least.

Figure 3:
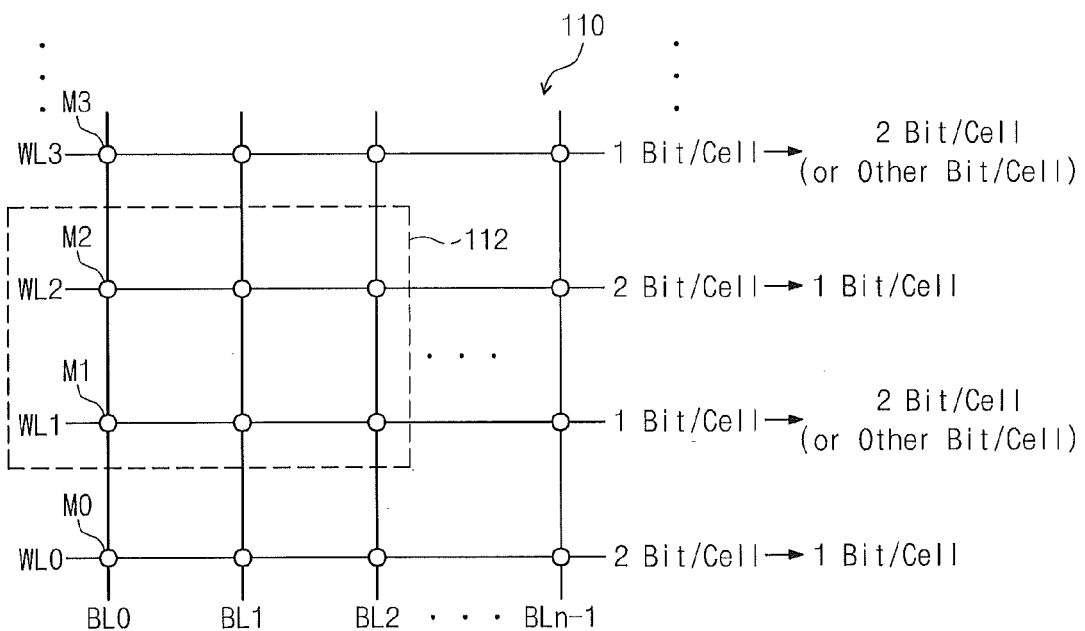

Exemplarily shown is in FIGS. 2 and 3 that the pattern of bit count per cell (i.e., the number of bits storable in a memory cell) is arranged to alternate with odd and even word lines.

In FIG. 2, memory cells coupled to the even word line can be set to store N-bit data per cell. Meanwhile, memory cells coupled to the odd word line can be set to store M-bit data. Here, M and N are positive integers larger than 0, but M≠N. In this case, the memory cells coupled to the even word line may operate as N-bit MLCs while the memory cells coupled to the odd word line may operate as M-bit MLCs. Further, memory cells coupled to one of the even and odd word lines may operate as SLCs.

The bit count information FL_EO set to the odd and even word lines, while erasing memory cells corresponding thereto, may be changed to others different from their prior values. For example, the memory cells coupled to the even word line may be changed to store M-bit data (or another bit count) from N-bit data in bit count per cell after the erasing operation (note the reference numeral 20 of FIG. 2). And the memory cells coupled to the odd word line may be changed to store N-bit data (or another bit count) from M-bit data in bit count per cell after the erasing operation (note the reference numeral 20 of FIG. 2). Here, the bit count information FL_EO assigned to the word line may be valued in variety without restriction to a specific one. For instance, as shown in FIG. 2, the bit count information FL_EO set to the even and odd word lines are modified to alternate with each other during the erasing operation, or to another pattern.

FIG. 3 exemplarily shows the feature that the bit count information FL_EO are arranged to alternate with MLCs (e.g., 2-bit MLCs) and SLCs (i.e., 1-bit SLCs) on the even and odd word lines.

Referring to FIG. 3, the memory cells coupled to the even word line are set to store 2-bit data per cell, while the memory cells coupled to the odd word line are set to store 1-bit data per cell. In this case, the memory cells coupled to the even word line may operate as 2-bit MLCs and the memory cells coupled to the odd word line may operate as 1-bit SLCs. The bit count arrangement with MLCs and SLCs shown in FIG. 3 is an embodiment according to the present invention, which is modifiable in various ways.

The bit count information FL_EO set to the odd and even word lines, while erasing memory cells corresponding thereto, may be changed to others different from their prior values. As an example, the memory cells coupled to the even word line may be changed to store 1-bit data (or another bit count) from 2-bit data in bit count per cell after the erasing operation. And the memory cells coupled to the odd word line may be changed to store 2-bit data (or another bit count) from 1-bit data in bit count per cell after the erasing operation. Here, the bit count information FL_EO assigned to the word line may be valued in variety without restriction to a specific one (e.g., 1 or 2 bits).

Figure 4:
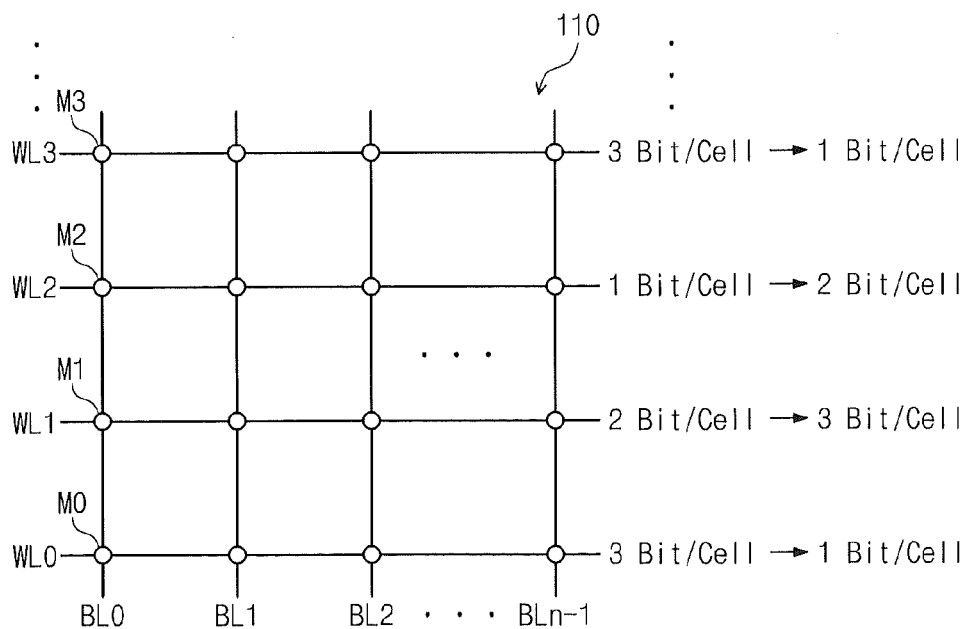
Figure 5:
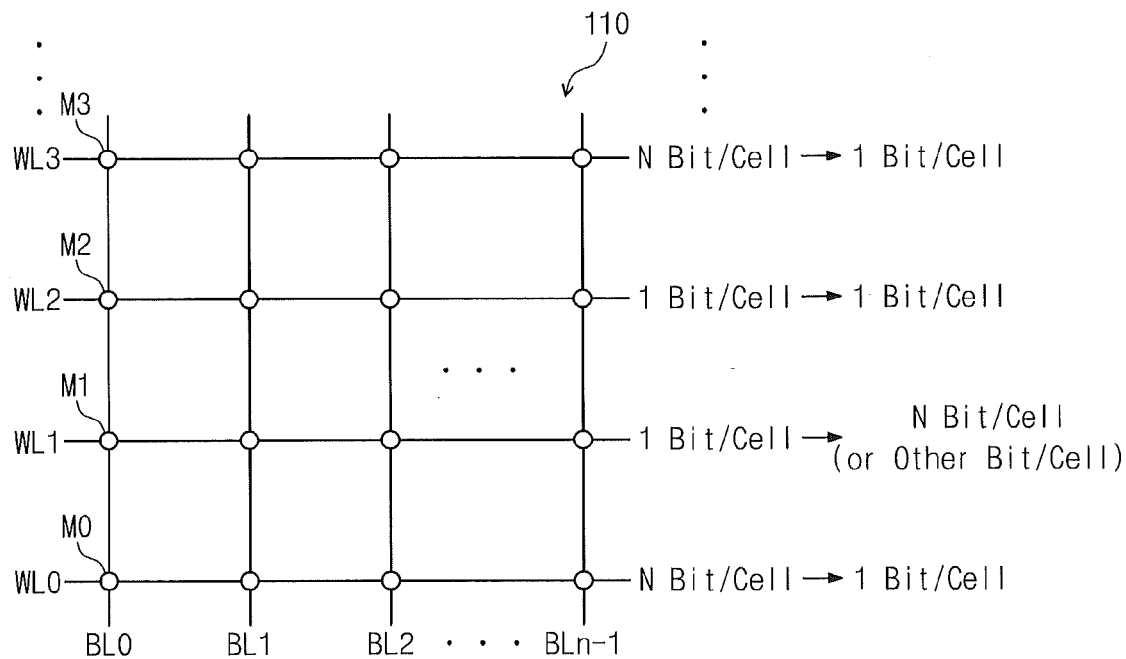

FIGS. 4 and 5 exemplarily show the feature that the bit count information FL_EO is arranged without alternation by the even and odd word lines.

Referring to FIG. 4, memory cells coupled to the first word line WL0 can be set to store 3-bit data per cell. Then, the memory cells coupled to the first word line WL0 may operate as 3-bit MLCs. Memory cells coupled to the second word line WL1 can be set to store 2-bit data per cell. Thereby, the memory cells coupled to the second word line WL1 may operate as 2-bit MLCs. Next, memory cells coupled to the third word line WL2 can be set to store 1-bit data per cell. Thus, the memory cells coupled to the third word line WL2 may operate as 1-bit SLCs.

As illustrated in FIG. 4, the allocation of the bit counts per cell for word lines (i.e., the bit count information FL_EO) can be regularized to periodically repeat every three word lines. The allocation pattern of the bit count information FL_EO shown in FIG. 4 is just an embodiment according to the present invention, but the bit count per cell for each word line is variable without restriction to a specific one. Furthermore, it is also permissible to modify a style of repeated pattern and the number of word lines corresponding to the repeated pattern in various ways.

Continuous to FIG. 5, the memory cells coupled to the first word line WL0 can be set to store N-bit data per cell (N>1; a positive integer). Then, the memory cells coupled to the first word line WL0 may operate as N-bit MLCs. The memory cells coupled to the second and third word lines WL1 and WL2 can be set to store 1-bit data per cell. Thereby, the memory cells coupled to the second and third word lines WL1 and WL2 may operate as 1-bit SLCs. As such, this allocation of the bit counts per cell for word lines can be regularized to periodically repeat every three word lines. The allocation pattern of the bit count per cell shown in FIG. 5 is just an embodiment according to the present invention, but variable without restriction to a specific one. It is also permissible to modify a style of repeated pattern and the number of word lines corresponding to the repeated pattern in various ways.

As seen from FIGS. 2 through 5, the bit counts per cell respective to word lines are arranged in regularity along word line.

As an example, referring to FIG. 2, considering the case that the memory cells of the even and odd word lines are set to store M and N-bit data, respectively, per cell, the bit counts allocated each to the word lines WL0~WLm-1 are regularized in the sequence of N-bit, M-bit, N-bit, M-bit, N-bit, . . . (see the reference numeral 10 of FIG. 2). Therefore, for economizing a data storage space and simplifying a process for analyzing data stored in the memory cells, the allocation pattern by word lines is managed in the unit of memory block, not stored every word line. For instance, since the bit count information allocated to the even and odd word lines is arranged to be alternate with each other, the present invention is embodied to store only the bit count information FL_EO assigned to one of the even and odd word lines. For this function, each memory block may include at lest a flag cell for storing the bit count information FL_EO assigned to one of the even and odd word lines. This feature of managing the bit count information FL_EO is applicable even to another case that the bit count information FL_EO is repeated in the unit of three (or more) word lines, not restrictive to two word lines, as shown in FIGS. 4 and 5.

Figure 6:
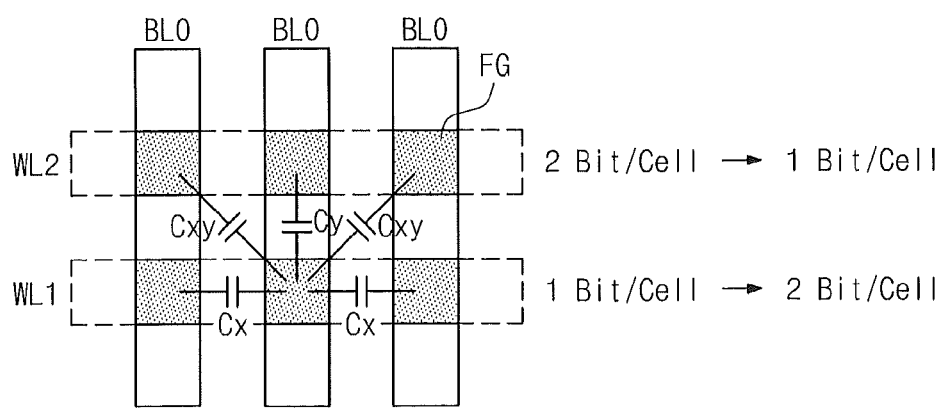

Now, referring to FIG. 6 hereinafter will be described capacitive couplings induced between adjacent word lines with relevance to the case of using the allocation pattern with the bit count information according to the present invention. FIG. 6 partly shows the memory cell array 110 shown in FIG. 3.

As a general case with respect to an arbitrary memory cell, e.g., the memory cell M1 (hereinafter referred to as 'reference memory cell'), parasitic capacitors (or coupling capacitors) Cx, Cxy, and Cy are basically resident between memory cells adjacent to the reference memory cell M1 as shown in FIG. 6. These parasitic capacitors Cx, Cxy, and Cy affect a voltage of the floating gate FG of the reference memory cell M1 during the programming operation, causing a threshold voltage distribution of the memory cell M1 to be wider. Such a phenomenon may be called T-poly coupling'. The F-poly coupling may happen to other memory cells M0, M2, M3, and M4 in the same result. Such extension of threshold voltage distribution of the memory cell M1 would degrade the reliability of the reading operation thereto. Moreover, the extension of the threshold voltage distribution becomes heavier as fine as the fabrication process and as large as the bit count per cell. As large as the bit counts of the memory cells coupled to an adjacent word line, the F-poly coupling effect from the adjacent word line further increases in the programming operation.

To prevent such an F-poly coupling effect, the present invention is embodied to set values of the bit count information FL_EO, which are each allocated to selected and adjacent word lines, different from each other. For instance, as shown in FIGS. 3 and 6, it is able to set the memory cells, which are coupled to the even word line, storing 2-bit data per cell, and to set the memory cells, which are coupled to the odd word line, storing 1-bit data per cell. In other words, if the bit count information FL_EO allocated to a word line is ranking on a relatively high value, the adjacent word line is allocated with a lower one of the bit count information FL_EO. According to such an allocation pattern, the total coupling capacitance may be reduced as given by Table 1.

allocation pattern of the bit count information FL_EO in the unit of word line(s) may result in differentiation of bit counts between adjacent word lines, so it reduces coupling capacitance to $\frac{3}{4}$ thereof between the adjacent word lines. This effect of coupling reduction may be more expanded in the case that there are adjacent word lines with lower values of the bit count information FL_EO (e.g., 1 bit) as shown in FIG. 5.

In the meantime, the bit count information FL_EO allocated in the word line unit is modified into another value, not maintaining its prior state, whenever conducting the erasing operation. As like this, if the bit count per cell is variable in the word line unit, it is able to prevent stress from concentrating on a specific word line. In other words, this transaction of bit count modification by word line makes it possible to entirely distribute the stress, which is weighted on the memory cells, over the memory cell array 110. Thus, it produces an effect on aging resistance of a specific memory cell, offering the higher efficiency to the wear leveling process.

Until now, the present invention has been described with an embodiment relevant to the NAND flash memory array shown in FIG. 2 for convenience of illustration. But the aforementioned structural and operational features of the flash memory device 100 according to the present invention are also applicable to a NOR flash memory device, as well as the NAND type. Further, the aforementioned features by the present invention can be applied to a charge trap flash (CTF) memory device where charge storage layers are made of insulation (or dielectric) films, as well as the flash memory devices where charge storage layers are made of conductive floating gates. That is, the present invention is allocable to all kinds of nonvolatile memory devices capable of storing plural bits per cell.

Figure 7:
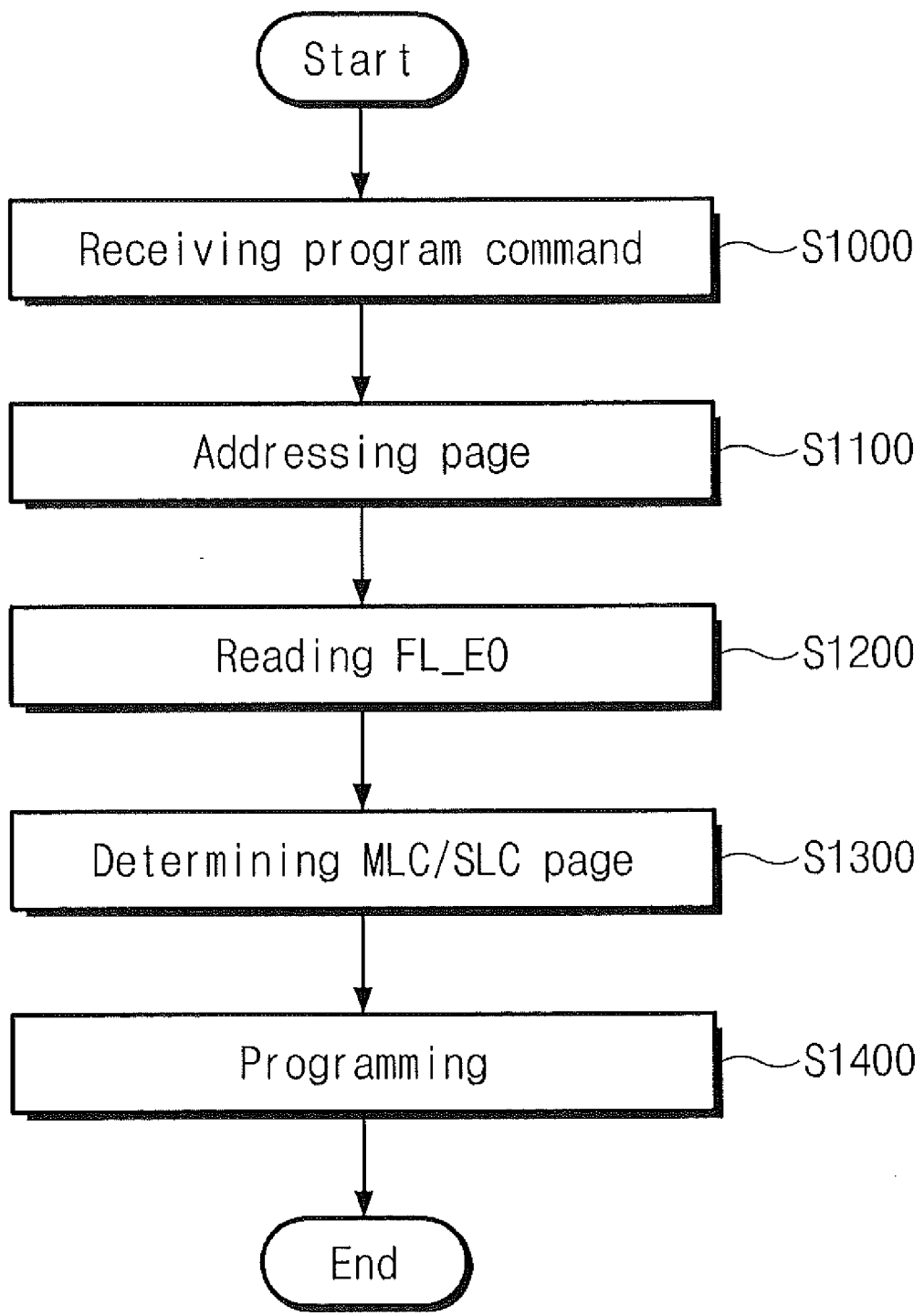
FIG. 7 is a flow chart of a programming operation by the flash memory device according to an embodiment of the present invention.

FIG. 7 is a flow chart of a programming operation by the flash memory device 100 according to the present invention.

Referring to FIG. 7, to begin the programming operation, the flash memory device 100 first receives a program command from a host (step S1000). The program command transferred from the host is provided to the flash memory device 100 by way of a controller. Then, the flash memory device 100 accepts an address from the controller and designates a page to be programmed (step S1100). The address put into the flash memory device 100 in the step S1100 is a physical address for the page to be programmed (i.e., program page). The controller transforms a logical address, which is provided from the host, into a physical address and provides the physical address to the flash memory device 100. An operation for transforming a logical address into a physical address may be conducted by means of a flash translation layer (FTL), which is called 'address mapping'.

After the addressing process for the program page, the flash memory device 100 operates to fetch the bit count informa-

TABLE 1

|  | Erased cell | Programmed cell |
|---|---|---|
| Even WL (SLC) | $\Delta V_x \cdot \frac{2C_x}{C_{tot}} + \Delta V_y \cdot \frac{2C_y}{C_{tot}} + \Delta V_{xy} \cdot \frac{2C_{xy}}{C_{tot}}$ | $\Delta V_x \cdot \frac{2C_x}{C_{tot}} + \Delta V_y \cdot \frac{2C_y}{C_{tot}} + \Delta V_{xy} \cdot \frac{2C_{xy}}{C_{tot}}$ |
| Odd WL (MLC) | $\Delta V_x \cdot \frac{2C_x}{C_{tot}} + \Delta V_y \cdot \frac{2C_y}{C_{tot}} + \Delta V_{xy} \cdot \frac{2C_{xy}}{C_{tot}}$ | $\Delta V_x \cdot \frac{2C_x}{C_{tot}}$ |

From Table 1, if the reference memory cell M1 is designed to be an SLC storing 1-bit data, it is able to find that the coupling capacitance of an erased state is as same as that of a programmed state. As can be seen from Table 1, the proposed tion FL_EO from a flag cell that corresponds to the addressed page (step S1200). After being read by the writing/reading circuit 12o of the flash memory device 100, the bit count information FL_EO is provided into the control logic circuit

150. The control logic circuit 150 determines whether the addressed page corresponds to an SLC or MLC page (i.e., whether the addressed page is to be stored in an SLC or MLC page), responding to the bit count information FL_EO read before (step S1300).

Next, the flash memory device 100 conducts the programming operation to the addressed page with reference to a page type determined by the step S1300 (step S1400). The programming operation executed through the step S1400 may be composed of plural programming loops. The program voltage Vpgm may be generated with a voltage level stepping up by the increment ΔV along repetition of the programming loops in the ISPP mode. An initial level of the program voltage Vpgm and a range of the voltage increment ΔV may be dependent on a type of the addressed page (i.e., SLC or MLC page). It is also variable in the number of times for applying the program voltages Vpgm in the programming loops, voltage levels, and durations of applying voltages, depending on the bit count information FL_EO provided by the writing/reading circuit 130.

Figure 8:
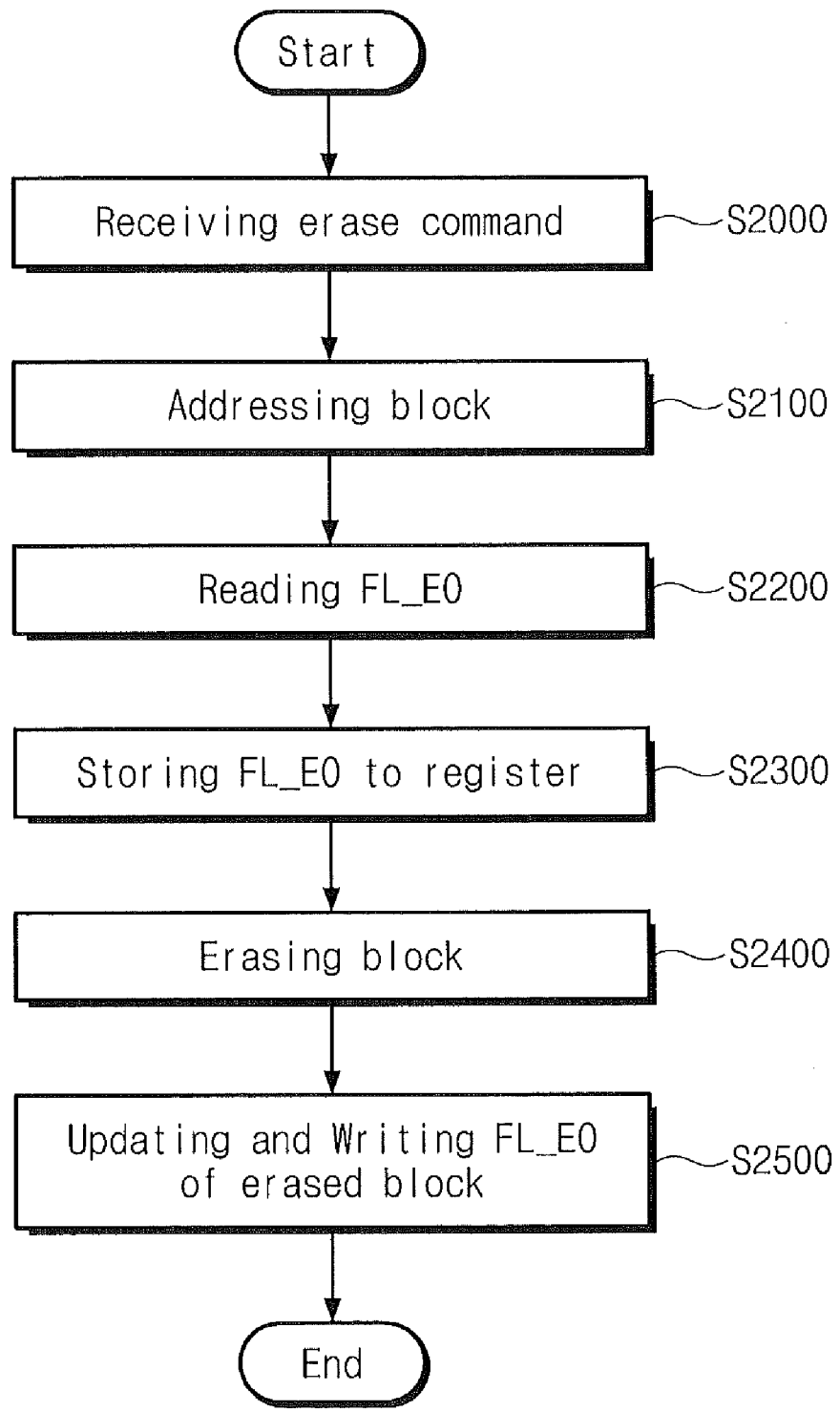
FIG. 8 is a flow chart of an erasing operation by the flash memory device according to an embodiment of the present invention.

FIG. 8 is a flow chart of an erasing operation by the flash memory device 100 according to the present invention.

Referring to FIG. 8, to begin the erasing operation, the flash memory device 100 first receives an erasing command from a host (step S2000). The erasing command transferred from the host is provided to the flash memory device 100 by way of a controller. Then, the flash memory device 100 accepts an address from the controller and designates a memory block to be erased (step S2100). The address put into the flash memory device 100 in the step S2100 is a physical address for the memory block to be erased. The controller transforms a logical address, which is provided from the host, into a physical address and provides the physical address to the flash memory device 100.

After the addressing process for the memory block to be erased, the flash memory device 100 operates to fetch the bit count information FL_EO from a flag cell that corresponds to the addressed block (step S2200). After moving the bit count information FL_EO, which has been read in the step S2200, into a data storage space (e.g., internal register or external controller) except the memory block to be erased (step S2300), the addressed memory block is erased (step S2400).

After conducting the erasing operation to the addressed memory block, the bit count information FL_EO, which has been moved into the data storage space out of the addressed memory block (i.e., the erased memory block), is updated to be a new value and written in a flag cell of the erased memory block (step S2500). The bit count information FL_EO updated through the step S2500 can be changed to another value different from its prior one as shown in FIGS. 2 through 5.

In the meantime, the bit count information FL_EO updated to a new value may be stored in a flag cell just after the erasing operation, or in a flag cell corresponding thereto when a page of the erased memory block is being programmed. For the latter case, the bit count information FL_EO is stored within a period laid on the programming operation, so that there is no additional time for storing the bit count information FL_EO. Additionally, since there is no need of process for storing a flag cell in the erasing operation, it shortens a time for the erasing operation. The aforementioned programming and erasing operations can be carried out in modification or transformation by the control logic circuit 150 or an external system (e.g., controller).

Figure 9:
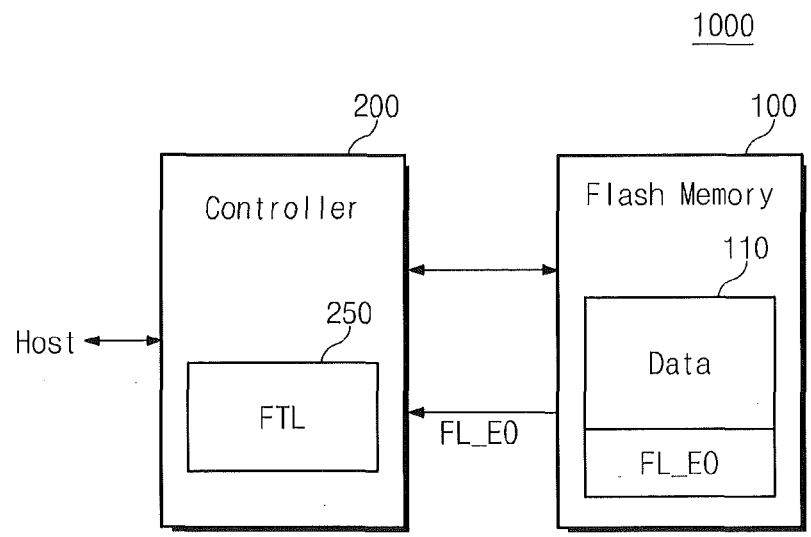
FIG. 9 is a block diagram of a memory system including the flash memory device shown in FIG. 1.

FIG. 9 is a block diagram of a memory system 1000 including the flash memory device 100 shown in FIG. 1.

Referring to FIG. 9, the memory system 1000 is comprised of the flash memory device and a controller 200. The flash memory device 100 is substantially configured in the same structure with that shown in FIG. 1. And programming and erasing operations of the flash memory device 100 are conducted in the same patterns with those shown in FIGS. 7 and 8. Thus, those structural and operational features will not be duplicated hereinafter in detail.

The memory cell array 110 of the flash memory device 100 is able to store normal data and accessory data (e.g., the bit count information FL_EO by word line). Each memory cell of the flash memory device 100 may be formed to store M or N-bit data (M and M are positive integers, but M≠N). Bit counts stored each in the memory cells may be set in the unit of word line. The bit count information FL_EO allocated each to the word lines may be reserved and modified in the unit of memory block (i.e., in the unit of word lines more than one at least; in the unit of plural word lines). The programming operation of the flash memory device 100 is controlled by way of analyzing the bit count information FL_EO stored in the unit of memory block. The bit count information FL_EO is rewritten into a flag cell corresponding thereto after being updated to a new value during the erasing operation (or during the programming operation after erasing). The bit count information FL_EO stored in the flash memory device 100 may be provided to the external controller 200. The controller 200 is configured to control the flash memory device 100.

The flash memory device 100 is inherently tied to functional limitation that makes it incapable to conduct overwriting, different from other memory devices. Hence, in order to write data into the flash memory device 100, the erasing operation muse precede the programming operation. This transaction of the flash memory device 100 is called 'erase-before-write' operation. In the flash memory device 100, a unit of data written at a time is smaller than that erased at a time (e.g., a unit page is less than a unit block in data amount). Such a gap of data amount between writing and erasing makes the flash memory device insufficient to be used as a main memory of a computing system, also acting as a hindrance in utilizing a general file system for hard disk as it is even though employed as a subsidiary memory in the system. For that reason, the controller 200 includes an FTL (i.e., flash translation layer) 250 as a kind of control program in order to hide the erasing operation of the flash memory device 100. The FTL 250 may be provided in the form of firmware.

The FTL 250 functions to map a logical address, which is generated by a file system, into an erased physical address of the flash memory device 100. The FTL 250 uses an address mapping table to enable a fast prosecution of address mapping. In general, the address mapping table is made up with an SRAM that is relatively high in cost. Owing to the address mapping function of the FTL 250, a host identifies the flash memory device as like a hard disk drive (or SRAM) and accesses the flash memory device in the same manner with such a hard disk drive. Additionally, the FTL 250 functions to protect a specific memory block of the flash memory device 100 from stress by way of the wear leveling process. The stress inflicted on the flash memory device 100 is very involved in a lifetime (or endurance) of the flash memory device 100. Major factors of the stress to the flash memory device are the number of erasing times, the number of programming times (i.e., the number of MLC programming times, for which a high voltage is applied in many times).

The bit count information FL_EO stored in the flash memory device 100 is provided to the controller 200 and used in the address mapping and wear leveling operations. If the controller 200 directly stores and manages the bit count information FL_EO, which is provided from the flash memory device 100, as it is an address mapping table, it is even permissible to skip a procedure of reading and checking the bit count information FL_EO from a page to be programmed or a block to be erased. Directly managing the bit count information FL_EO, the controller 200 is able to determine whether an address corresponds to MLC or SLC by itself in the address mapping operation.

The memory system 1000 shown in FIG. 9 may be configured in a memory card and/or memory card system. In this case, the controller 200 may be configured to communicate with an external system (e.g., host) through one of various interface protocols such as universal serial bus (USB), multimedia card (MMC) interface, peripheral component interconnection-express (PCI-E) interface, serial advanced technology attachment (SATA), parallel advanced technology attachment (PATA), small computer system interface (SCSI) interface, serial attached SCSI (SAS) interface, enhanced small disk interface (SDI), integrated drive electronics (IDE), and so forth. Flash memory devices are kinds of nonvolatile memories capable of retaining data stored therein even without power supply. With a rapid increase of using mobile apparatuses such as cellular phones, personal digital assistants (PDA), digital cameras, portable gaming consoles, and MP3, the flash memory devices are widely employed as code storage, as well as data storage. The flash memory devices may be also utilized in home applications such as high-definition televisions, digital versatile disks (DVDs), routers, and global positioning systems (GPSs).

Figure 10:
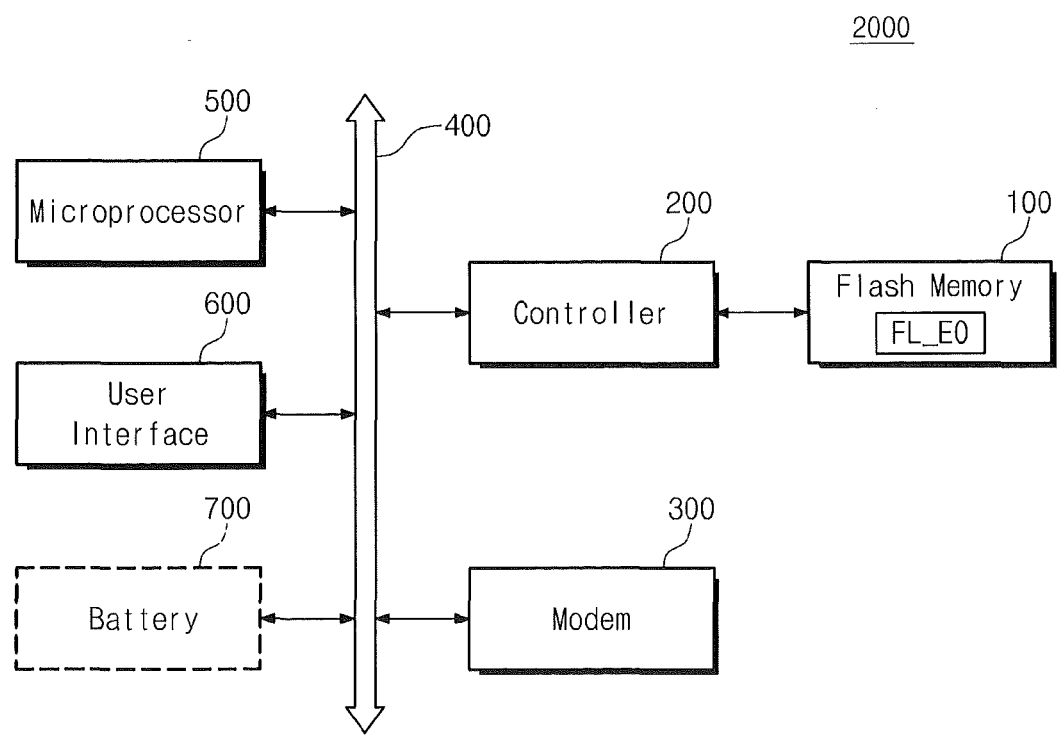
FIG. 10 is a block diagram of a computing system including a flash memory device according to an embodiment of the present invention.

FIG. 10 is a block diagram of a computing system 2000 including the flash memory device 100 by the present invention.

Referring to FIG. 10, the computing system 2000 according to the present invention is organized by including the flash memory device 100, the controller 200, a modem 300 such as a baseband chipset, a microprocessor 500, and a user interface 600, all of which are electrically connected to a bus 400. The flash memory device 200 may be configured substantially the same with that shown in FIG. 1, so it will not be further described in detail.

If the computing system 2000 shown in FIG. 10 is a kind of mobile apparatus, it may be further comprised of a battery 700 for supplying power thereto. Although not shown in FIG. 10, the computing system 2000 may be further equipped with an application chipset, a camera image processor (e.g., complementary metal-oxide-semiconductor (CMOS) image sensor; i.e., CIS), a mobile DRAM, and so forth. The controller 200 and the flash memory device 100, for example, may constitute a memory card and/or memory card system, or a solid state drive/disk (SSD) using a nonvolatile memory for data storage.

The flash memory device 100 and/or the controller 200 according to the present invention can be mounted on the aforementioned system through various types of packages. For instance, the flash memory device 100 and/or the controller 200 may be placed thereon by means of any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP). In an embodiment by the present invention, the memory cells can be implemented by using one of various cell structures. The memory cell with a charge storage layer may be formed in a charge trap flash (CTF) structure having a charge trap layer, a stacked flash structure where arrays are stacked in multiplicity, and a flash structure without source and drain regions, or a pin-type flash structure.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operating a flash memory device, comprising:
reading a first bit count from a block of flash memory, in response to a first command to program a first page of memory cells in the block of flash memory; and then
programming the first page of memory cells with a first page of data using the first bit count to specify a first number of bits of data to be stored in the first page of memory cells.

2. The method of claim 1, wherein said programming the first page of memory cells is followed by:
erasing the first page of memory cells; and then
programming the block of flash memory with a second bit count that specifies a second number of bits of data to be stored in the first page of memory cells.

3. The method of claim 2, further comprising:
reading the second bit count from the block of flash memory, in response to a second command to program the first page of memory cells; and then
programming the first page of memory cells with a second page of data using the second bit count to specify the second number of bits of data to be stored in the first page of memory cells.

4. The method of claim 3, wherein the first bit count and the second bit count are unequal.

5. A method of operating a flash memory device, comprising:
reading a first bit count stored in the flash memory device; and
programming a page of non-volatile memory cells in the flash memory device using the first bit count to specify a first number of bits of data to be stored in each of a plurality of non-volatile memory cells within the page.

6. The method of claim 5, further comprising:
erasing the page of non-volatile memory cells;
reading a second bit count stored in the flash memory device, said second bit count having a value greater than or less than the first bit count; and
programming a page of non-volatile memory cells in the flash memory device using the second bit count to specify a second number of bits of data to be stored in each of the plurality of non-volatile memory cells within the page.

* * * * *